United States Patent
Ikegami et al.

(10) Patent No.: US 7,220,534 B2
(45) Date of Patent: May 22, 2007

(54) PHOTOSENSITIVE COMPOSITION AND COLOR FILTER

(75) Inventors: Fumiko Ikegami, Tokyo (JP); Mie Shimizu, Tokyo (JP); Takeshi Itoi, Tokyo (JP)

(73) Assignees: Toyo Ink Mfg. Co., Ltd., Tokyo (JP); Toppan Printing Co., Ltd., Tokyo (JP)

( * ) Notice: Subject to any disclaimer, the term of this patent is extended or adjusted under 35 U.S.C. 154(b) by 59 days.

(21) Appl. No.: 10/995,376

(22) Filed: Nov. 24, 2004

(65) Prior Publication Data

US 2005/0112501 A1  May 26, 2005

(30) Foreign Application Priority Data

Nov. 26, 2003  (JP) .............................. 2003-395151

(51) Int. Cl.
*G02B 5/20* (2006.01)
*G03F 7/038* (2006.01)

(52) U.S. Cl. ..................... 430/284.1; 525/293; 430/18

(58) Field of Classification Search ..................... None
See application file for complete search history.

(56) References Cited

U.S. PATENT DOCUMENTS 4,537,855 A * 8/1985 Ide .......................... 430/285.1

5,539,064 A * 7/1996 Hashimoto et al. ...... 430/280.1

FOREIGN PATENT DOCUMENTS

JP      2002-14468          1/2002

OTHER PUBLICATIONS

Sartomer Product Bulletin: SR-444, Penaerythritol Triacrylate, one page, Sartomer Company, Inc, dated Nov. 1998 from www.sartomer.com*

* cited by examiner

*Primary Examiner*—Cynthia Hamilton
(74) *Attorney, Agent, or Firm*—Nixon & Vanderhye P.C.

(57) ABSTRACT

A photosensitive composition contains a photosensitive resin and a colorant. The photosensitive resin includes (A) a copolymer of (a1) at least one first polymerizable monomer containing 2 to 6 hydroxyl groups with (a2) at least one second polymerizable monomer other than the first polymerizable monomer, and (B) at least one compound (B) containing an ethylenically unsaturated double bond and a functional group capable of reacting with hydroxyl group. The compound (B) has been reacted with the copolymer (A). A color filter has at least one filter segment formed using the photosensitive composition.

11 Claims, No Drawings

PHOTOSENSITIVE COMPOSITION AND COLOR FILTER

CROSS-REFERENCE TO RELATED APPLICATIONS

This application is based upon and claims the benefit of priority from prior Japanese Patent Application No. 2003-395151, filed Nov. 26, 2003, the entire contents of which are incorporated herein by reference.

BACKGROUND OF THE INVENTION

1. Field of the Invention

The present invention relates to a photosensitive composition, and more specifically, relates to a high sensitive photosensitive composition useful for forming colored filter segments such as red-, green-, blue-, yellow-, orange-, cyan- and magenta-colored filter segments and black matrices in a color filter which is used for a liquid crystal display device and a solid imaging element. Further, the present invention relates to a color filter formed using the photosensitive composition.

2. Description of the Related Art

A color filter includes fine stripe filter segments having two or more different hues arranged in parallel to or intersected with each other on the surface of a transparent substrate such as glass, or fine stripe filter segments horizontally and vertically arranged at a constant sequence. The filter segments are fine and the width is several microns to several hundred microns, and they are regularly arranged at a predetermined sequence by every hue.

In general, a transparent electrode for driving liquid crystal is formed on the color filter by vapor deposition or spattering in a color liquid crystal display device. Further, an alignment film for aligning the liquid crystal in a predetermined direction is formed over the transparent electrode. In order to make the best use of the performances of these transparent electrode and alignment film, the formation of them is required to be carried out at a high temperature of usually 200° C. or more, and preferably 230° C. or more.

Accordingly, the manufacture of the color filter is mainly performed at present by a method called a pigment dispersion method wherein a pigment, which is excellent in light resistance and heat resistance, are employed as a colorant.

According to the pigment dispersion method, a photosensitive colored composition (pigment resist), which disperses a pigment in a photosensitive transparent resin solution, is coated on a transparent substrate such as glass, and the solvent is removed by drying. Then the pattern exposure was conducted, and the unexposed portions are removed in a development step to form a pattern of the first color (first filter segments). Subsequently, a processing such as a heat treatment is applied to the first filter segments, if required. Thereafter, the same procedures as those described above are repeated successively for all of the remaining filter colors. In this way, a desired color filter is produced.

High sensitivity, good solubility of the non-image portions in a developing liquid and high chemical resistance of the image portions are important characteristics required in the formation of the filter segments using a photosensitive colored composition containing pigments. Requests for a color filter with higher color density and black matrices with high optical density (OD value) have been recently enhanced, and the concentration of a colorant in a photosensitive colored composition tends to be increased. However, when the concentration of a colorant is increased, other characteristics are affected. For example, the exposed portions are not sufficiently cured because of increase in the light absorption of a colorant itself. Thus, the increase of the colorant concentration is in a trade-off relationship with the maintenance of various characteristics such as sensitivity of a photosensitive composition.

A photopolymerizable composition which uses a specific binder resin in order to enhance the sensitivity and the solubility in a developing liquid is disclosed in Jpn. Pat. Appln. KOKAI Publication No. 2002-14468. This composition is high sensitive and superior in the solubility in a developing liquid. However, the binder resin is obtained by adding an epoxy compound having an ethylenically unsaturated double bond to a polymer having a carboxyl group to form hydroxyl groups by this addition reaction. The formed hydroxyl groups are subjected to an addition reaction with an isocyanate compound having an ethylenically unsaturated double bond, thus forming the binder resin.

It is necessary for a photosensitive transparent resin to be designed such that the photosensitive transparent resin satisfies many characteristics such as stability, solubility and chemical resistance by adjusting the kind and ratio of monomers. Accordingly, there is an upper limit for the ratio of monomers which can introduce an ethylenically unsaturated double bond, and it is important for coexistence of sensitivity and other characteristics at how low monomer ratio many ethylenically unsaturated double bonds are introduced.

BRIEF SUMMARY OF THE INVENTION

Accordingly, an object of the present invention is to provide a photosensitive composition in which high sensitivity can be compatible with the maintenance of physical properties such as superior dispersion stability, solubility and chemical resistance.

According to a first aspect of the present invention, there is provided a photosensitive composition comprising: a photosensitive resin comprising (A) a copolymer of (a1) at least one first polymerizable monomer containing 2 to 6 hydroxyl groups with (a2) at least one second polymerizable monomer other than the first polymerizable monomer, and (B) at least one compound containing an ethylenically unsaturated double bond and a functional group capable of reacting with hydroxyl group, the compound (B) having been reacted with the copolymer (A); and a colorant.

According to a second aspect of there is provided a color filter comprising at least one filter segment formed using the photosensitive composition of the invention.

DETAILED DESCRIPTION OF THE INVENTION

Firstly, a photosensitive composition according to the present invention will be described.

A photosensitive composition according to the present invention contains a photosensitive resin comprising (A) a copolymer of (a1) at least one first polymerizable monomer containing 2 to 6 hydroxyl groups with (a2) at least one second polymerizable monomer other than the first polymerizable monomer, and (B) at least one compound (B) containing an ethylenically unsaturated double bond and a functional group capable of reacting with hydroxyl group, the compound (B) having been reacted with the copolymer (A), and also contains a colorant. The composition is suitable for production of a color filter.

The first polymerizable monomer (a1) constituting the copolymer (A) can be selected from compounds each having 2 to 6 hydroxyl groups and an ethylenically unsaturated double bond. These compounds can be represented by, for example, a general formula (1):

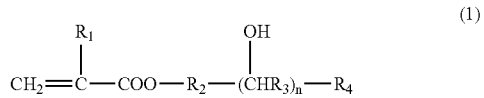
(1)

where each of $R_1$ and $R_4$ represents independently a hydrogen atom, or an unsubstituted or substituted alkyl group having 1 to 5 carbons, $R_2$ represents an alkylene group having 1 to 4 carbons, $R_3$ represents an alkylene group having 1 to 4 carbons or represents a single bond, and n represents an integer of 2 to 6.

The monomer represented by the general formula (1) includes a monoester of a polyhydric alcohol having an ethylenically unsaturated double bond. Glycerol mono(meth)acrylate is preferable.

The second polymerizable monomer (a2) constituting the copolymer (A) is a polymerizable monomer which can be copolymerized with the first polymerizable monomer (a1), and is different from the first polymerizable monomers (a1). The second monomer (a2) usually has no alcoholic hydroxyl groups. Examples of the second polymerizable monomer (a2) include (meth)acrylic acid; (meth)acrylate esters such as methyl (meth)acrylate, ethyl (meth)acrylate, propyl (meth)acrylate, isopropyl (meth)acrylate, butyl (meth)acrylate, isobutyl (meth)acrylate, tert-butyl (meth)acrylate, benzyl (meth)acrylate, phenyl (meth)acrylate, cyclohexyl (meth)acrylate, phenoxyethyl (meth)acrylate, 2-ethylhexyl (meth)acrylate, isobornyl (meth)acrylate, 2-hydroxyethyl (meth)acrylate, and tetrahydrofurfuryl (meth)acrylate; N-vinyl pyrrolidone; styrene compounds such as styrene and α-methylstyrene; acrylamides such as (meth)acrylamide, methylol (meth)acrylamide, alkoxymethylol (meth)acrylamide and diacetone (meth)acrylamide; other vinyl compounds such as (meth)acrylonitrile, ethylene, propylene, butylenes, vinyl chloride and vinyl acetate; and macromonomers such as a poly(methyl methacrylate) macromonomer and a polystyrene macromonomer. These monomers can be used singly or in combination. As the second monomer, (meth)acrylic acid is preferable.

The ratio of the first polymerizable monomer (a1) to the second polymerizable monomer (a2) in the copolymer (A) is preferably 5–95% by weight: 95–5% by weight, and more preferably 30–70% by weight: 70–30% by weight. When the proportion of the first polymerizable monomer (a1) is less than 5% by weight, the number of the ethylenically unsaturated double bonds which can be introduced becomes small and the value of the double bond equivalent of the photosensitive resin becomes large; therefore sufficient sensitivity cannot be obtained. When the proportion of the first polymerizable monomer (a1) exceeds 95% by weight, many ethylenically unsaturated double bonds can be introduced but the proportion of the second polymerizable monomer (a2) becomes small; therefore it is difficult to maintain physical properties such as dispersion stability, solubility and chemical resistance.

The synthesis of the copolymer (A) is generally carried out at 50 to 150° C. for 2 to 10 hours in the presence of an initiator under an inert gas flow. The synthesis of the copolymer (A) may be carried out in the presence of a solvent, if necessary.

The initiator used for the synthesis of the copolymer (A) includes organic peroxides such as benzoyl peroxide, cumene hydroperoxide, tert-butyl hydroperoxide, diisopropylperoxy carbonate, di-tert-butyl peroxide and tert-butyl peroxybenzoate; and azo compounds such as 2,2'-azobisisobutyronitrile, etc. The initiator is preferably used in an amount of 1 to 20 parts by weight based on 100 parts by weight of the total of the first and the second polymerizable monomers.

The solvent which can be used for the synthesis of the copolymer (A) includes water; organic solvents miscible with water; acetic acid esters such as ethylcellosolve acetate and propylene glycol monomethyl ether acetate; ketones such as cyclohexanone and methyl isobutyl ketone; xylene, and ethylbenzene. The organic solvent miscible with water includes alcohols such as ethyl alcohol, isopropyl alcohol and n-propyl alcohol; and monoalkyl or dialkyl ether of ethylene glycol or diethylene glycol.

The photosensitive resin is obtained by reacting the compound (B) having an ethylenically unsaturated double bond and a functional group capable of reacting with hydroxyl group with the copolymer (A) obtained by the above-mentioned reaction. The functional group which can react with hydroxyl group includes isocyanate group, and carboxyl group. Needless to say, when the functional group is isocyanate group, the copolymer (A) and the compound (B) are bonded through a urethane linkage by the reaction. When the functional group is carboxyl group, the copolymer (A) and the compound (B) are bonded through an ester linkage by the reaction. As the functional group, isocyanate group is preferable in particular from the viewpoint of reactivity. In other words, the copolymer (A) and the compound (B) are bonded through the linkage formed by the reaction of the hydroxyl groups of the copolymer (A) with the functional group of the compound (B).

Examples of the compound having isocyanate group and an ethylenically unsaturated double bond include 2-acryloylethyl isocyanate, and 2-methacryloylethyl isocyanate. Examples of the compound having carboxyl group and an ethylenically unsaturated double bond include acrylic acid, methacrylic acid, and maleic anhydride.

The reaction of the copolymer (A) with the compound (B) can be carried out by adding dropwise the compound (B) to a solution of the copolymer (A) in the presence of a small amount of catalyst. As the catalyst, dibutyltin laurate may be used. Furhter, a polymerization inhibitor such as p-methoxyphenol, hydroquinone, naphthylamine, tert-butylcathecol or 2,3-di-tert-butyl-p-cresol may be used as required. The ethylenically unsaturated double bonds derived from the compound (B) are introduced into the copolymer through the hydroxyl groups (A) by the above reaction.

The amount of the ethylenically unsaturated double bonds which are introduced into the copolymer (A) through the hydroxyl groups is represented by the "double bond equivalent" of the photosensitive resin obtained. The double bond equivalent is defined by the equation below and is a measure of the amount of double bonds which are contained in the molecule. In the case of the photosensitive resin having the same molecular weight, the smaller the value of the double bond equivalent is, the more the amount of double bonds introduced becomes.

Double bond equivalent=[molecular weight of repeating unit]/[number of double bonds in repeating unit]

The double bond equivalent of the photosensitive resin in the present invention is preferably 200 to 2000 and more preferably 300 to 900. When the double bond equivalent of the photosensitive resin is less than 200, the proportion of the first polymerizable monomer (a1) having hydroxyl groups which introduce the ethylenically unsaturated double bonds becomes large; therefore the second polymerizable monomer (a2) can not be copolymerized in an amount sufficient to maintain various properties. When the double bond equivalent exceeds 2000, sufficient sensitivity cannot be obtained because the number of the ethylenically unsaturated double bonds introduced becomes small.

Further, in view of good dispersablity of a colorant in the resin, the weight-average molecular weight (Mw) of the photosensitive resin is preferably 2000 to 200000 and more preferably 5000 to 50000.

The photosensitive composition according to the present invention contains a colorant in addition to the above-mentioned photosensitive resin. As the colorant, an organic or inorganic pigment can be used singly or in combination. The photosensitive resin of the invention can be used in an amount of 40 to 250% based on the weight of the colorant.

As the pigment, a pigment having high coloring property and high thermal resistance, in particular, a pigment having high resistance to thermal decomposition is preferable. Usually, an organic pigment is used.

Examples of the organic pigment which can be used in the photosensitive composition of the present invention are shown below with color index numbers.

For a red colored composition for forming red filter segments, a red pigment such as C.I. Pigment Red 7, 9, 14, 41, 48:1, 48:2, 48:3, 48:4, 81:1, 81:2, 81:3, 97, 122, 123, 146, 149, 168, 177, 178, 180, 184, 185, 187, 192, 200, 202, 208, 210, 215, 216, 217, 220, 223, 224, 226, 227, 228, 240, 246, 254, 255, 264 or 272 can be used. A yellow pigment or an orange pigment can be additionally used in the red-colored composition.

For a yellow-colored composition for forming yellow filter segments, a yellow pigment such as C.I. Pigment Yellow 1, 2. 3, 4, 5, 6, 10, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213 or 214 can be used.

For an orange-colored composition for forming orange filter segments, an orange pigment such as C.I. Pigment Orange 36, 43, 51, 55, 59, 61, 71 or 73 can be used.

For a green-colored composition for forming green filter segments, a green pigment such as C.I. Pigment Green 7, 10, 36 or 37 can be used. A yellow pigment can be additionally used in combination in the green-colored composition.

For a blue-colored composition for forming blue filter segments, a blue pigment such as C.I. Pigment Blue 15, 15:1, 15:2, 15:3, 15:4, 15:6, 16, 22, 60 or 64 can be used. A violet pigment such as C.I. Pigment Violet 1, 19, 23, 27, 29, 30, 32, 37, 40, 42 or 50 can be additionally used in the blue-colored composition.

For a cyan-colored composition for forming cyan filter segments, a blue pigment such as C.I. Pigment Blue 15:1, 15:2, 15:4, 15:3, 15:6, 16 or 81 can be used.

For a magenta-colored composition for forming magenta filter segments, a violet pigment and a red pigment such as C.I. Pigment Violet 1 and 19, and C.I. Pigment Red 144, 146, 177, 169 and 81 can be used. A yellow pigment can be additionally used in the magenta-colored composition.

Further, as a black colorant for black matrices, carbon black, titanium black, aniline black, an anthraquinone black pigment, a perylene black pigment, specifically, C.I. Pigment Black 6, 7, 12, 20, 31 or 32 can be used. Among these, carbon black is preferable. The surface of carbon black may be treated with, e.g., a resin.

Further, examples of inorganic pigment include titanium oxide, barium sulfate, zinc sulfide, lead sulfate, yellow lead, zinc yellow, red iron (III) oxide, cadmium red, navy blue, Prussian blue, chromium oxide green, cobalt green, amber, and synthetic iron black. The inorganic pigment is used in combination with the organic pigment for securing good coating property, sensitivity, developing property and the like while balancing chroma with brightness.

The photosensitive composition of the present invention can contain a dye for toning in an amount not lowering thermal resistance.

The photosensitive composition of the present invention can contain a non-photosensitive transparent resin, its precursor or a mixture thereof for controlling solubility in and resistance to a developing liquid. The non-photosensitive transparent resin is a transparent resin which has no ethylenically unsaturated double bonds and exhibits a light transmittance of preferably 80% or more, more preferably 95% or more with respect to the whole visible wavelengths of 400 to 700 nm. The non-photosensitive transparent resin includes a thermoplastic and a thermosetting resin. Its precursor includes a monomer and an oligomer which produce the non-photosensitive transparent resin upon curing by irradiation of radiation, and these can be used singly or in combination.

Examples of the non-photosensitive transparent resin include a butyral resin, a styrene-maleic acid copolymer, a chlorinated polyethylene, a chlorinated polypropylene, a polyvinyl chloride, a vinyl chloride-vinyl acetate copolymer, a polyvinyl acetate, a polyurethane resin, a polyester resin, an acrylic resin, an alkyd resin, a styrene resin, a polyamide resin, a rubber resin, a cyclized rubber resin, a cellulose, a polybutadiene, and a polyimide resin. Examples of the thermosetting resin include an epoxy resin, a benzoguanamine resin, a rosin modified maleic acid resin, a rosin modified fumaric acid resin, a melamine resin, a urea resin, and a phenolic resin.

Examples of the monomer and oligomer as the precursor of the non-photosensitive transparent resin include various acrylate esters and methacrylate esters such as methyl (meth)acrylate, ethyl (meth)acrylate, 2-hydroxyethyl (meth)acrylate, 2-hydroxypropyl (meth)acrylate, cyclohexyl (meth)acrylate, β-carboxyethyl (meth)acrylate, polyethylene glycol di(meth)acrylate, 1,6-hexanediol di(meth)acrylate, triethylene glycol di(meth)acrylate, tripropylene glycol di(meth)acrylate, trimethylolpropane tri(meth)acrylate, pentaerythrytol tri(meth)acrylate, 1,6-hexanediol diglycidyl ether di(meth)acrylate, bisphenol A diglycidyl ether di(meth)acrylate, neopentyl glycol diglycidyl ether di(meth)acrylate, dipentaerythrytol hexa(meth)acrylate, tricyclodecanyl (meth)acrylate, ester (meth)acrylate, (meth)acrylate of methylolated melamine, epoxy (meth)acrylate, urethane acrylate; (meth)acrylic acid, styrene, vinyl acetate, hydroxyethyl vinyl ether, ethylene glycol divinyl ether, pentaerythrytol trivinyl ether, (meth)acrylamide, N-hydroxymethyl (meth)acrylamide, and N-vinyl formamide, acrylonitrile.

The non-photosensitive transparent resin, its precursor or a mixture thereof can be used in an amount of 5 to 250% based on the weight of the colorant used.

The photosensitive composition of the present invention can be prepared by finely dispersing one or more pigments in the photosensitive resin using various dispersion means such as a three-roll mill, a two-roll mill, a sand mill, a kneader, an attritor or a paint conditioner.

When the pigment as the colorant is dispersed in the photosensitive resin, a dispersing aid such as a resin type pigment dispersing agent, a dye derivative or a surfactant can be used. Since the dispersing aid is superior in dispersing the pigment and has great effect to prevent the re-agglomeration of the pigment after dispersion, a color filter superior in transparency is obtained when the photosensitive composition in which the pigment is dispersed in the photosensitive resin using the dispersing aid is used.

The resin type pigment dispersing agent has a portion with an affinity to a pigment which portion has a property of adsorbing on the pigment, and a portion compatible with a pigment career, and functions to stabilize the dispersion of a pigment in the photosensitive resin by being adsorbed on the pigment. As the resin type pigment dispersing agent, a polyurethnane, a polycarboxylic acid ester such as a polyacrylate, an unsaturated polyamide, a polycarboxylic acid, a (partial) amine salt of a polycarboxylic acid, an ammonium salt of a polycarboxylic acid, an alkylamine salt of a polycarboxylic acid, a polysiloxane, a long chain polyaminoamide phosphate salt, an ester of hydroxyl group-containing polycarboxylic acid and a modified product thereof, an amide formed by reaction of a poly(lower alkyleneimine) with a polyester having a free carboxyl group, or a salt thereof can be used. Further, a water soluble resin or polymeric compound such as a (meth)acrylic acid-styrene copolymer, a (meth)acrylic acid-(meth)acrylate ester copolymer, a styrene-maleic acid copolymer, a polyvinyl alcohol or a polyvinyl pyrrolidone, a polyester, a modified polyacrylate, an adduct of ethylene oxide/propylene oxide can also be used. These can be used singly or in combination.

The dye derivative as the dispersing aid is a compound in which a substituent is introduced into an organic dye. The organic dye also includes pale yellow aromatic polycyclic compounds such as a naphthalene compound and an anthraquinone compound which are generally not called a dye. As the dye derivative, those described in, for example, Jpn. Pat. Appln. KOKAI Publication No. 63-305173, and Jpn. Pat. Appln. KOKOKU Publication Nos. 57-15620, 59-40172, 63-17102 and 5-9469 can be used, and these can be used singly or in combination.

The surfactant as the dispersing aid includes anionic surfactants such as sodium lauryl sulfate, polyoxyethylene alkyl ether sulfate, sodium dodecylbenzene sulfonate, an alkali salt of styrene-acrylic acid copolymer, sodium stearate, sodium alkylnaphthalene sulfonate, sodium alkyldiphenyl ether disulfonate, monoethanolamine lauryl sulfate, triethanolamine lauryl sulfate, ammonium lauryl sulfate, monoethanolamine stearate, sodium stearate, sodium lauryl sulfate and monoethanolamine of styrene-acrylic acid copolymer; nonionic surfactants such as polyoxyethylene oleyl ether, polyoxyethylene lauryl ether, polyoxyethylene nonylphenyl ether, polyoxyethylene sorbitan monostearate and polyoxyethylene glycol mono laurate; cationic surfactants such as a quaternary alkylammonium salt and an ethylene oxide adduct thereof; and amphoteric surfactants such as alkyl betaines such as alkyldimethylamino acetic acid betaine and alkylimidazolines. These can be used singly or in combination.

The dispersing aid for the pigment can be used in an amount of 0.1 to 30% based on the weight of the pigment.

The photosensitive composition of the present invention can contain a solvent in order to sufficiently disperse the colorant in the photosensitive resin and facilitate coating of the composition on a transparent substrate to a thickness of 0.2 to 5 μm when dried to form filter segments. Examples of the solvent include cyclohexanone, ethylcellosolve acetate, butyl cellosolve acetate, 1-methoxy-2-propyl acetate, diethylene glycol dimethyl ether, ethylbenzene, ethylene glycol diethyl ether, xylene, ethylcellosolve, methyl-n-amyl ketone, propylene glycol monomethyl ether toluene, methyl ethyl ketone, ethyl acetate, methanol, ethanol, isopropanol, butanol, isobutyl ketone, and a petroleum solvent. These can be used singly or in combination.

The solvent can be used in an amount of 800% to 4000% based on the weight of the colorant.

Further, the photosensitive composition of the present invention can contain a storage stabilizer for stabilizing the viscosity of the composition over time. Examples of the storage stabilizer include quaternary ammonium chlorides such as benzyltrimethyl chloride and diethylhydroxyamine, organic acids such as lactic acid and oxalic acid and methyl ether thereof, t-butylpyrocatechol, organic phosphines such as tetraethylphosphine and tetraphenylphosphine, and a salt of phosphorous acid. The storage stabilizer can be used by an amount of 0.1% to 10% based on the weight of the colorant.

When the composition is cured by ultraviolet irradiation, a photopolymerization initiator is added to the photosensitive composition of the present invention.

As the photopolymerization initiator, there can be used acetophenone photopolymerization initiators such as 4-phenoxydichloroacetophenone, 4-t-butyl-dichloroacetophenone, diethoxyacetophenone, 1-(4-isopropylphenyl)-2-hydroxy-2-methylpropan-1-on, 1-hydroxycyclohexyl phenyl ketone and 2-benzyl-2-dimethylamino-1-(4-morphorinophenyl)-butan-1-on; benzoin photopolymerization initiators such as benzoin, benzoin methyl ether, benzoin ethyl ether, benzoin isopropyl ether and benzyl dimethyl ketal; benzophenone photopolymerization initiators such as benzophenone, benzoylbenzoic acid, methyl benzoylbenzate, 4-phenylbenzophenone, hydroxybenzophenone, acrylated benzophenone and 4-benzoyl-4'-methyldiphenyl sulfide; thioxanthone photopolymerization initiators such as thioxanthone, 2-chlorothioxanthone, 2-methylthioxanthone, isopropylthioxanthone and 2,4-diisopylthioxanthone; triazine photopolymerization initiators such as 2,4,6-trichloro-s-triazine, 2-phenyl-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-piperonyl-4,6-bis(trichloromethyl)-s-triazine, 2,4-bis(trichloromethyl)-6-styryl-s-triazine, 2-(naphtho-1-yl)-4,6-bis(trichloromethyl)-s-triazine, 2-(4-methoxy-naphtho-1-yl)-4,6-bis(trichloromethyl)-s-triazine, 2,4-trichloromethyl (piperonyl)-6-triazine and 2,4-trichloromethyl(4'-methoxystyryl)-6-triazine; borate photopolymerization initiators, carbazole photopolymerization initiators, and imidazole photopolymerization initiators.

The photopolymerization initiator can be used in an amount of 10 to 200% based on the weight of the colorant.

The above-mentioned photopolymerization initiator can be used singly or in combination. However, as an sensitizer, compounds such as α-acyloxy ester, acylphosphine oxide, methylphenyl glyoxylate, benzyl, 9,10-phenanthlene quinine, camphor quinine, ethylanthraquinone, 4,4'-diethyl-isophthalophenone and 3,3',4,4'-tetra(t-butylperoxycarbonyl)benzophenone can be additionally used. The sensitizer can be used in an amount of 0.1 to 30% based on the weight of the photopolymerization initiator.

The photosensitive composition of the present invention can be prepared in the form of a solvent developing type or alkali developing type colored resist. The resist can be prepared by dispersing the colorant such as a pigment, and the above-mentioned additional substances, if necessary, in a photosensitive composition which contains the photosensitive resin mentioned above, the monomer as the precursor of the non-photosensitive resin mentioned above and the photopolymerization initiator mentioned above.

The colorant is preferably contained in the photosensitive composition containing a solvent in an amount 0.5 to 10% by weight. The colorant is contained preferably in an amount of 10 to 60% by weight, more preferably 20 to 50% by weight, in the final filter segment. The residue of the filter segment is substantially constituted by the resinous binder provided by the photosensitive resin, the monomer and the like.

It is preferable that large grains of 5 μm or more, preferably 1 μm or more and more preferably 0.5 μm or more and mixed dusts are removed by means of, e.g., centrifugal separation, a sintered filter or a membrane filter from the photosensitive composition of the present invention.

Next, the color filter of the present invention is explained.

The color filter of the present invention has at least one filter segment which is formed using the photosensitive composition of the present invention. The color filter includes an additive mixture type which comprises at least one red filter segment, at least one green filter segment and at least one blue filter segment, and a subtractive mixture type which comprises at least one magenta filter segment, at least one cyan filter segment and at least one yellow filter segment. The pigments respectively used for a red colored photosensitive composition which forms the red filter segment, a green colored photosensitive composition which forms the green filter segment and a blue colored photosensitive composition which forms the blue filter segment are already described. Similarly, the pigments respectively used for a magenta colored photosensitive composition which forms the magenta filter segment, a cyan colored photosensitive composition which forms the cyan filter segment and a yellow colored photosensitive composition which forms the yellow filter segment are already described.

The color filter of the present invention can be prepared by forming respective filter segments on a transparent substrate using the photosensitive composition of the present invention by a photolithographic method.

As the transparent substrate, a glass plate or a resin plate such as a polycarbonate, a polymethyl methacrylate and a polyethylene terephthalate can be used.

The formation of the respective color filter segments by the photolithographic method can be carried out by the following method. That is, the photosensitive composition prepared in the form of a solvent developing type or alkali developing type colored resist is coated on a transparent substrate by a coating method such as spray coating, spin coating, slit coating or roll coating to a thickness of 0.2 to 5 μm when dried. Then, ultraviolet exposure is carried out on the dried coating through a mask having a predetermined pattern provided on the coating in a contact or non-contact state. Then, the uncured portion is removed by immersing the coating in a solvent or alkali developing liquid or by spraying the developing liquid with, e.g., a spray onto the coating. Similar operations are repeated for other colors, preparing the color filter. Heating can be conducted to accelerate the polymerization of the colored resist, if necessary. The photolithographic method can produce color filters having higher precision than those produced by a printing method.

As the alkali developing liquid, an aqueous solution of, e.g., sodium carbonate or sodium hydroxide can be used. Also, an organic alkali such as dimethylbenzylamine or triethanolamine can be used. An anti-foaming agent or a surfactant can be added to the developing liquid.

Further, ultraviolet exposure can be also carried out after coating a water-soluble or alkali-soluble resin, such as a polyvinyl alcohol or a water-soluble acrylic resin$_o$ on the coated and dried colored resist, and drying the coated resin to form a film which prevents polymerization inhibition caused by oxygen, in order to increase the sensitivity of ultraviolet exposure.

The color filter of the present invention can also be produced by an electrodeposition method, or a transcription method other than the photolithographic method. The electrodeposition method is a method of producing a color filter by forming respective color filter segments on a transparent electroconductive film formed on a transparent substrate, by electrophoresis of colloid grains utilizing the transparent electroconductive film.

The transcription method is a method of preparing a color filter by forming a color filter layer on the surface of a peeling transcription base sheet and transcribing the color filter layer on a desired transparent substrate.

The present invention is explained below by way of its Examples, but the present invention is not limited thereto. Note that "parts" in Examples and Comparative Examples which follow are by weight.

SYNTHESIS EXAMPLE 1

Synthesis 1 of Photosensitive Resin of the Present Invention

In a reaction vessel, 560 parts of cyclohexanone were charged. The vessel was heated to 80° C. while flowing nitrogen gas in the vessel, and a mixture of the monomers and a thermal polymerization initiator indicated below was added dropwise at that temperature over one hour to effect polymerization reaction:

| | |
|---|---|
| Methacrylic acid | 34.0 parts |
| Methyl methacrylate | 23.0 parts |
| n-Butyl methacrylate | 45.0 parts |
| Glycerol monomethacrylate | 47.0 parts |
| 2,2'-azobisisobutyronitrile | 4.0 parts |

After the addition, the resulting reaction mixture was further reacted at 80° C. for 3 hours, then a solution of 1.0 part of azobisisobutyronitrile in 55 parts of cyclohexanone was added, and the reaction was continued at 80° C. for one hour to obtain a copolymer solution.

Then, a mixture of compounds indicated below was added dropwise at 70° C. over three hours to 338 parts of the copolymer solution obtained:

| | |
|---|---|
| 2-Methacroylethyl isocyanate | 32.0 parts |
| Dibutyltin laurate | 0.4 parts |
| Cyclohexanone | 120.0 parts |

After cooling the reaction mixture to room temperature, about 2 g of the resin solution was sampled and dried at 180° C. for 20 minutes by heating, and non-volatiles were measured. Based on the measurement results, cyclohexanone was added such that the non-volatiles amounted to 20% by weight in the remaining resin solution, thus preparing a desired solution of the photosensitive resin. The weight-average molecular weight of the photosensitive resin obtained was 20000 and the double bond equivalent was 470.

SYNTHESIS EXAMPLE 2

Synthesis 2 of Photosensitive Resin of the Present Invention

In a reaction vessel, 570 parts of cyclohexanone was charged. The vessel was heated at 80° C. while flowing nitrogen gas in the reaction vessel, and a mixture of monomers and a thermal polymerization initiator indicated below was added dropwise at that temperature over one hour to carry out polymerization reaction:

| | |
|---|---|
| Methacrylic acid | 23.0 parts |
| Methyl methacrylate | 23.0 parts |
| Benzyl methacrylate | 57.0 parts |
| Glycerol monomethacrylate | 48.0 parts |
| 2,2'-azobisisobutyronitrile | 3.0 parts |

After the addition, the mixture was further reacted at 80° C. for 3 hours, then a solution of 1.0 part of azobisisobutyronitrile in 50 parts of cyclohexanone was added, and the reaction was continued at 80° C. for one hour to obtain a copolymer solution.

Then, a mixture of compounds indicated below was added dropwise at 70° C. over three hours to 336 parts of the copolymer solution obtained:

| | |
|---|---|
| 2-Methacroylethyl isocyanate | 33.0 parts |
| Dibutyltin laurate | 0.4 parts |
| Cyclohexanone | 130.0 parts |

After cooling the reaction mixture to room temperature, about 2 g of the resin solution was sampled and dried at 180° C. for 20 minutes by heating, and non-volatiles were measured. Based on the measurement result, cyclohexanone was added such that the non-volatiles amounted to 20% by weight in the remaining resin solution, thus preparing a desired solution of the photosensitive resin. The weight-average molecular weight of the photosensitive resin obtained was 30000 and the double bond equivalent was 460.

SYNTHESIS EXAMPLE 3

Synthesis 3 of Photosensitive Resin of the Present Invention

In a reaction vessel, 520 parts of cyclohexanone was charged. The vessel was heated at 80° C. while flowing nitrogen gas in the reaction vessel, and a mixture of monomers and a thermal polymerization initiator indicated below was added dropwise at that temperature over one hour to carry out polymerization reaction:

| | |
|---|---|
| Methacrylic acid | 7.0 parts |
| Methyl methacrylate | 7.0 parts |
| 2-Hydroxyethyl methacrylate | 63.0 parts |
| Glycerol monomethacrylate | 66.0 parts |
| 2,2'-azobisisobutyronitrile | 4.0 parts |

After the addition, the mixture was further reacted at 80° C. for 3 hours, then a solution of 1.0 part of azobisisobutyronitrile in 70 parts of cyclohexanone was added, and the reaction was continued at 80° C. for one hour to obtain a copolymer solution.

Then, a mixture of compounds indicated below was added dropwise at 70° C. over three hours to 220 parts of the copolymer solution obtained:

| | |
|---|---|
| 2-Methacroylethyl isocyanate | 56.0 parts |
| Dibutyltin laurate | 0.4 parts |
| Cyclohexanone | 220.0 parts |

After cooling the reaction mixture to room temperature, about 2 g of the resin solution was sampled and dried at 180° C. for 20 minutes by heating, and non-volatiles were measured. Based on the measurement result, cyclohexanone was added such that the non-volatiles amounted to 20% by weight in the remaining resin solution, thus preparing a desired solution of the photosensitive resin. The weight average molecular weight of the photosensitive resin obtained was 20000 and the double bond equivalent was 270.

SYNTHESIS EXAMPLE 4

Synthesis 4 of Photosensitive Resin of the Present Invention

In a reaction vessel, 480 parts of cyclohexanone was charged. The vessel was heated at 80° C. while flowing nitrogen gas in the reaction vessel, and a mixture of monomers and a thermal polymerization initiator indicated below was added dropwise at that temperature over one hour to carry out polymerization reaction:

| | |
|---|---|
| Methacrylic acid | 32.0 parts |
| Methyl methacrylate | 24.0 parts |
| n-Butyl methacrylate | 16.0 parts |
| Benzyl methacrylate | 48.0 parts |
| Glycerol monomethacrylate | 15.0 parts |
| 2,2'-azobisisobutyronitrile | 4.0 parts |

After the addition, the mixture was further reacted at 80° C. for 3 hours, then a solution of 1.0 part of azobisisobutyronitrile in 80 parts of cyclohexanone was added, and the reaction was further continued at 80° C. for one hour to obtain a copolymer solution.

Then, a mixture of compounds indicated below was added dropwise at 70° C. over three hours to 445 parts of the copolymer solution obtained:

| | |
|---|---|
| 2-Methacroylethyl isocyanate | 14.0 parts |
| Dibutyltin laurate | 0.4 parts |
| Cyclohexanone | 55.0 parts |

After cooling the reaction mixture to room temperature, about 2 g of the resin solution was sampled and dried at 180° C. for 20 minutes by heating, and non-volatiles were measured. Based on the measurement result, cyclohexanone was added such that the non-volatiles amounted to 20% by weight in the remaining resin solution, thus preparing a desired solution of the photosensitive resin. The weight average molecular weight of the photosensitive resin obtained was 20000 and the double bond equivalent was 1000.

SYNTHESIS EXAMPLE 5

Synthesis 1 of Comparative Photosensitive Resin

In a reaction vessel, 560 parts of cyclohexanone was charged. The vessel was heated at 80° C. while flowing nitrogen gas in the reaction vessel, and a mixture of monomers and a thermal polymerization initiator indicated below was added dropwise at that temperature over one hour to carry out polymerization reaction:

| | |
|---|---|
| Methacrylic acid | 22.0 parts |
| n-Butyl methacrylate | 22.0 parts |
| 2-Hydroxyethyl methacrylate | 104.0 parts |
| 2,2'-azobisisobutyronitrile | 4.0 parts |

After the addition, the mixture was further reacted at 80° C. for 3 hours, then a solution of 1.0 part of azobisisobutyronitrile in 50 parts of cyclohexanone was added, and the reaction was further continued at 80° C. for one hour to obtain a copolymer solution.

Then, a mixture of compounds indicated below was added dropwise at 70° C. over three hours to 338 parts of the copolymer solution obtained:

| | |
|---|---|
| 2-Methacroylethyl isocyanate | 33.0 parts |
| Dibutyltin laurate | 0.4 parts |
| Cyclohexanone | 130.0 parts |

After cooling the reaction mixture to room temperature, about 2 g of the resin solution was sampled and dried at 180° C. for 20 minutes by heating, and non-volatiles were measured. Based on the measurement result, cyclohexanone was added such that the non-volatiles amounted to 20% by weight in the remaining resin solution, thus preparing a desired solution of the photosensitive resin. The weight average molecular weight of the photosensitive resin obtained was about 20000 and the double bond equivalent was 470.

SYNTHESIS EXAMPLE 6

Synthesis 2 of Comparative Photosensitive Resin

In a reaction vessel, 570 parts of cyclohexanone was charged. The vessel was heated at 80° C. while flowing nitrogen gas in the reaction vessel, and a mixture of monomers and a thermal polymerization initiator indicated below was added dropwise at that temperature over one hour to carry out polymerization reaction:

| | |
|---|---|
| Methacrylic acid | 7.0 parts |
| Methyl methacrylate | 11.0 parts |
| Benzyl methacrylate | 32.0 parts |
| 2-Hydroxyethyl methacrylate | 101.0 parts |
| 2,2'-azobisisobutyronitrile | 3.0 parts |

After the addition, the mixture was further reacted at 80° C. for 3 hours, then a solution of 1.0 part of azobisisobutyronitrile in 50 parts of cyclohexanone was added thereto, and the reaction was further continued at 80° C. for one hour to obtain a copolymer solution.

Then, a mixture of compounds indicated below was added dropwise at 70° C. over three hours to 337 parts of the copolymer solution obtained.

| | |
|---|---|
| 2-Methacroylethyl isocyanate | 33.0 parts |
| Dibutyltin laurate | 0.4 parts |
| Cyclohexanone | 130.0 parts |

After cooling the reaction mixture to room temperature, about 2 g of the resin solution was sampled and dried at 180° C. for 20 minutes by heating, and non-volatiles were measured. Based on the measurement result, cyclohexanone was added such that the non-volatiles amounted to 20% by weight in the remaining resin solution, thus preparing a desired solution of the photosensitive resin. The weight average molecular weight of the photosensitive resin obtained was about 30000 and the double bond equivalent was 460.

EXAMPLE 1

After uniformly stirring and mixing a mixture having a composition indicated below, the mixture was dispersed for 5 hours with a sand mill using glass beads having a diameter of 1 mm and then filtered with a filter with 5 μm to prepare a pigment dispersion:

| | |
|---|---|
| Diketopyrrolopyrrole pigment (C.I. Pigment Red 254) ("IRGAPHOR Red B-CF" available from Ciba-Geigy Japan Limited) | 8.33 parts |
| Anthraquinone pigment (C.I. Pigment Red 177) ("CHROMOPHTHAL Red A2B" available from Ciba-Geigy Japan Limited) | 1.33 parts |
| Anthraquinone pigment (C.I. Pigment Yellow 199) ("CHROMOPHTHAL Yellow GT-AD" available from Ciba-Geigy Japan Limited) | 0.34 parts |
| Phosphoric acid ester-base pigment dispersant ("BYK111" available from BYK Chemie Japan K.K.) | 1.00 parts |
| Photosensitive resin solution prepared in Synthesis Example 1 | 40.00 parts |
| Cyclohexanone | 48.00 parts |

Then, a mixture having a composition indicated below was stirred and mixed uniformly and was filtered with a filter with 1 μm to obtain a red resist:

| | |
|---|---|
| The pigment dispersion noted above | 45.0 parts |
| Photosensitive resin solution prepared in Synthesis Example 1 | 15.0 parts |
| Trimethylolpropane triacrylate ("NK ESTER ATMPT" available from SHIN-NAKAMURA CHEMICAL CO., LTD) | 5.6 parts |

-continued

| | |
|---|---|
| Photopolymerization initiator ("IRGACURE-907" available from Ciba-Geigy Japan Limited) | 2.0 parts |
| Sensitizer ("EAB-F" available from HODOGAYA CHEMICAL CO., LTD.) | 0.2 parts |
| Cyclohexanone | 32.2 parts |

EXAMPLE 2

A red resist was prepared as in Example 1 except that the photosensitive resin solution prepared in Synthesis Example 2 was used in place of the photosensitive resin solution prepared in Synthesis Example 1.

EXAMPLE 3

A red resist was prepared as in Example 1 except that the photosensitive resin solution prepared in Synthesis Example 3 was used in place of the photosensitive resin solution prepared in Synthesis Example 1.

EXAMPLE 4

A red resist was prepared as in Example 1 except that the photosensitive resin solution prepared in Synthesis Example 4 was used in place of the photosensitive resin solution prepared in Synthesis Example 1.

COMPARATIVE EXAMPLE 1

A red resist was prepared as in Example 1 except that the photosensitive resin solution prepared in Synthesis Example 5 was used in place of the photosensitive resin solution prepared in Synthesis Example 1.

COMPARATIVE EXAMPLE 2

A red resist was prepared as in Example 1 except that the photosensitive resin solution prepared in Synthesis Example 6 was used in place of the photosensitive resin solution prepared in Synthesis Example 1.

With respect to the resists obtained in Examples and Comparative Examples given above, their solvent resistance and sensitivity were evaluated as follows.

<Solvent Resistance>

The resist was coated on a glass substrate with a size of 100 mm×100 mm and a thickness of 1.1 mm using a spin coater to obtain a coated substrate. Then, after drying at 70° C. for 20 minutes, ultraviolet exposure with integrated luminous quantity of 150 mJ was done on the coated substrate through a mask which made fine line patterns of 50 µm using an ultra high pressure mercury lamp. After exposure, the resist was developed with an alkali developing liquid for 90 seconds to form stripe-shaped filter segments on the substrate. The developed substrate was heat-treated at 230° C. for 60 minutes. The alkali developing liquid used was a solution consisting of 1.5% by weight of sodium carbonate, 0.5% by weight of sodium hydrogencarbonate, 8.0% by weight of an anionic surfactant (PERILEX NBL available from Kao Corporation) and 90% by weight of water.

After the portion of the substrate was immersed in N-methylpyrrolidone (NMP) for 30 minutes, the chromaticity of the immersed portion and the portion not immersed was measured by means of a microspectrophotometer ("OSP-SP100" available from OLYMPUS CORPORATION) using a C-light source, and color difference (ΔE) was calculated. Further, the condition of the pattern surface was observed by means of an optical microscope. Those in which no change was observed were evaluated as ◯, those in which cracks were slightly observed were evaluated as Δ, and those in which sever cracks were observed were evaluated as X. The results are shown in Table 1.

TABLE 1

| | Example | | | | Comparative Example | |
|---|---|---|---|---|---|---|
| | 1 | 2 | 3 | 4 | 1 | 2 |
| Weight average molecular weight of photosensitive resin | 20000 | 30000 | 20000 | 20000 | 20000 | 30000 |
| Double bond quivalent of photosensitive resin | 470 | 460 | 270 | 1000 | 470 | 460 |
| ΔE | 1.5 | 1.0 | 2.0 | 1.0 | 5.0 | 3.0 |
| Appearance | ◯ | ◯ | ◯ | ◯ | X | Δ |

<Evaluation of Sensitivity>

The resist was coated on a transparent glass substrate to a thickness of 1.0 µm. The coating was pre-baked at 70° C. for 20 minutes, and was exposed to ultraviolet through a mask which exposed narrow line patterns with a width of 50 µm. The exposure was carried out at eight levels of exposure quantity from 10 mJ/cm² to 200 mJ/cm². After exposure, development was carried out for 90 seconds with an alkali developing liquid to form stripe-shaped filter segments. The residual film rate after exposure and development was calculated with the thickness of the unexposed/undeveloped portion set as 100. Based on the residual film rate curves obtained, the exposure quantity at which the residual film rate reaches the saturation was defined as the saturated exposure quantity and the residual film rate was defined as the saturated residual film rate. The saturated exposure quantity and the residual film rate obtained are shown in Table 2.

TABLE 2

| | Example | | | | Comparative Example | |
|---|---|---|---|---|---|---|
| | 1 | 2 | 3 | 4 | 1 | 2 |
| Saturated residual film rate (%) | 90 | 90 | 90 | 90 | 70 | 80 |
| Saturated exposure quantity (mJ/cm²) | 80 | 80 | 50 | 100 | 100 | 100 |

As shown in Tables 1 and 2, when the red filter segment was formed using the red resist obtained in Comparative Example 1, ΔE with NMP immersion was large, the saturated exposure quantity was high and the saturated residual film rate was low. That is, sensitivity was low. Further, when the red filter segment was formed using the red resist obtained in Comparative Example 2, ΔE with NMP immersion was small, but the saturated exposure quantity was high and sensitivity was low.

On the contrary, the ΔE of the red filter segment formed using the red resists obtained in Examples 1 to 4 was small, and the result of observation with a microscope was also good. Further, the red filter segment showed the low saturated exposure quantity and the high saturated residual film rate, and sensitivity was high.

As described above, the photosensitive composition of the present invention contains a photosensitive resin formed of a copolymer having a polymerizable monomer having 2 to 6 hydroxyl groups as its repeating units into which ethylenically unsaturated double bonds are efficiently introduced through reaction with the hydroxyl groups. Therefore, it has advantages that it is highly sensitive and has superior dispersion stability, and chemical resistance. Further, since the photosensitive composition of the present invention has higher solvent resistance and higher sensitivity than a conventional one, it is sufficiently cured with small luminous quantity and superior in productivity. Accordingly, a color-separating color filter for a transmission type and reflection type liquid crystal display device and for a solid imaging device can be stably produced by forming filter segments using the photosensitive colored composition of the present invention.

What is claimed is:

1. A photosensitive composition comprising:
   a photosensitive resin comprising (A) a copolymer of (a1) at least one first polymerizable monomer containing 2 to 6 hydroxyl groups with (a2) at least one second polymerizable monomer other than the first polymerizable monomer, and (B) at least one compound containing an ethylenically unsaturated double bond and an isocyanate group capable of reacting with hydroxyl group, the compound (B) having been reacted with the copolymer (A); and
   a colorant.

2. The composition according to claim 1, wherein the first polymerizable monomer (a1) is represented by a general formula (1):

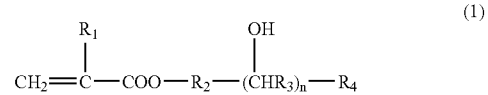

where each of $R_1$ and $R_4$ represents independently a hydrogen atom, or an unsubstituted or substituted alkyl group having 1 to 5 carbon atoms, $R_2$ represents an alkylene group having 1 to 4 carbon atoms, $R_3$ represents an alkylene group having 1 to 4 carbon atoms or represents a single bond, and n represents an integer of from 2 to 6.

3. The composition according to claim 1, wherein the second polymerizable monomer (a2) is selected from the group consisting of an acrylate ester, a styrene compound, acrylamide, a vinyl compound and a macromonomer thereof.

4. The composition according to claim 1, wherein the copolymer (A) and the compound (B) are bonded through a urethane linkage.

5. The composition according to claim 1, wherein the first polymerizable monomer (a1) and the second polymerizable monomer (a2) are present at a weight ratio of 5–95% by weight: 95–5% by weight in the copolymer (A).

6. The composition according to claim 1, wherein the photosensitive resin has a weight-average molecular weight of 2,000 to 200,000.

7. The composition according to claim 1, wherein the photosensitive resin has a double bond equivalent of 200 to 2,000.

8. The composition according to claim 1, wherein the photosensitive resin is present in an amount of 40 to 250% based on the weight of the colorant.

9. The composition according to claim 1, further comprising a non-photosensitive resin, its precursor or a mixture thereof.

10. The composition according to claim 9, wherein the non-photosensitive resin, its precursor or a mixture thereof is present in an amount of 5 to 250% based on the weight of the colorant.

11. A color filter comprising at least one filter segment formed using the composition according to claim 1.

* * * * *